(12) United States Patent
Elgin, II et al.

(10) Patent No.: US 6,657,527 B2
(45) Date of Patent: Dec. 2, 2003

(54) APPARATUS AND METHOD FOR FABRICATING MAGNET SUPPORT STRUCTURE

(75) Inventors: Stephen Randolph Elgin, II, Florence, SC (US); Michael Robert Eggleston, Florence, SC (US); Richard Thomas Hackett, Sumter, SC (US); Somanath Nagendra, Edison, NJ (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/119,966

(22) Filed: Apr. 11, 2002

(65) Prior Publication Data

US 2003/0193383 A1 Oct. 16, 2003

(51) Int. Cl.⁷ .............................................. H01F 5/00
(52) U.S. Cl. ....................................... 335/299; 336/198
(58) Field of Search ................................ 335/216, 299; 324/318, 319, 320; 336/198

(56) References Cited

U.S. PATENT DOCUMENTS

| | | | |
|---|---|---|---|
| 5,568,110 A | 10/1996 | Dorri et al. ................ | 335/216 |
| 5,594,401 A | 1/1997 | Dorri et al. ................ | 335/216 |
| 5,597,435 A * | 1/1997 | Desautels et al. ........... | 156/245 |
| 5,721,523 A | 2/1998 | Dorri et al. ................ | 335/216 |
| 6,215,384 B1 | 4/2001 | Laskaris et al. ............ | 335/299 |
| 6,218,923 B1 | 4/2001 | Laskaris et al. ............ | 335/299 |

* cited by examiner

Primary Examiner—Ramon M. Barrera
(74) Attorney, Agent, or Firm—Jean K. Testa; Patrick K. Patnode

(57) ABSTRACT

The present invention provides a magnet support structure. A cylindrical portion comprises a plurality of laminated composite layers concentrically assembled to one another along a longitudinal axis. An integral left flange is comprised of the laminated composite layers concentrically assembled with respect to a left flange axis. The left flange axis is perpendicular to the longitudinal axis. An integral right flange is comprised of the laminated composite layers concentrically assembled with respect to a right flange axis. The right flange axis is perpendicular to the longitudinal axis. A method for fabricating the magnet support structure comprises concentrically assembling the plurality of laminated composite layers along the longitudinal axis forming the cylindrical portion. Concentrically assembling the laminated composite layers with respect to the left flange axis forming the integral left flange. Concentrically assembling the laminated composite layers with respect to the right flange axis forming the integral right flange.

46 Claims, 8 Drawing Sheets

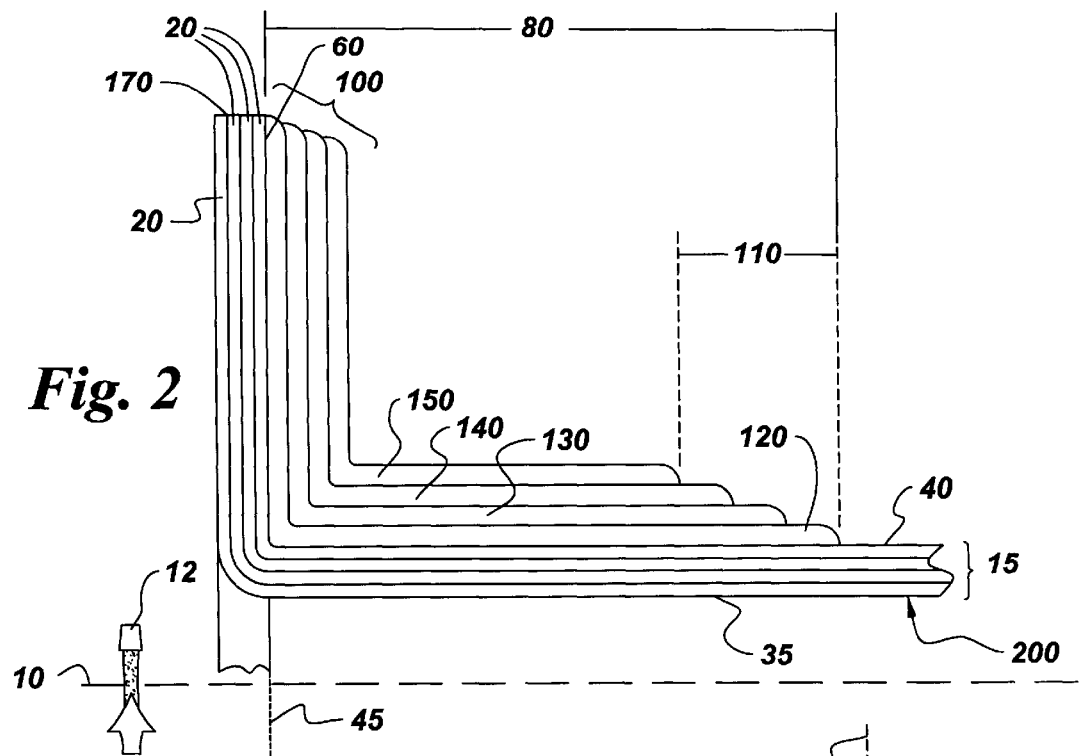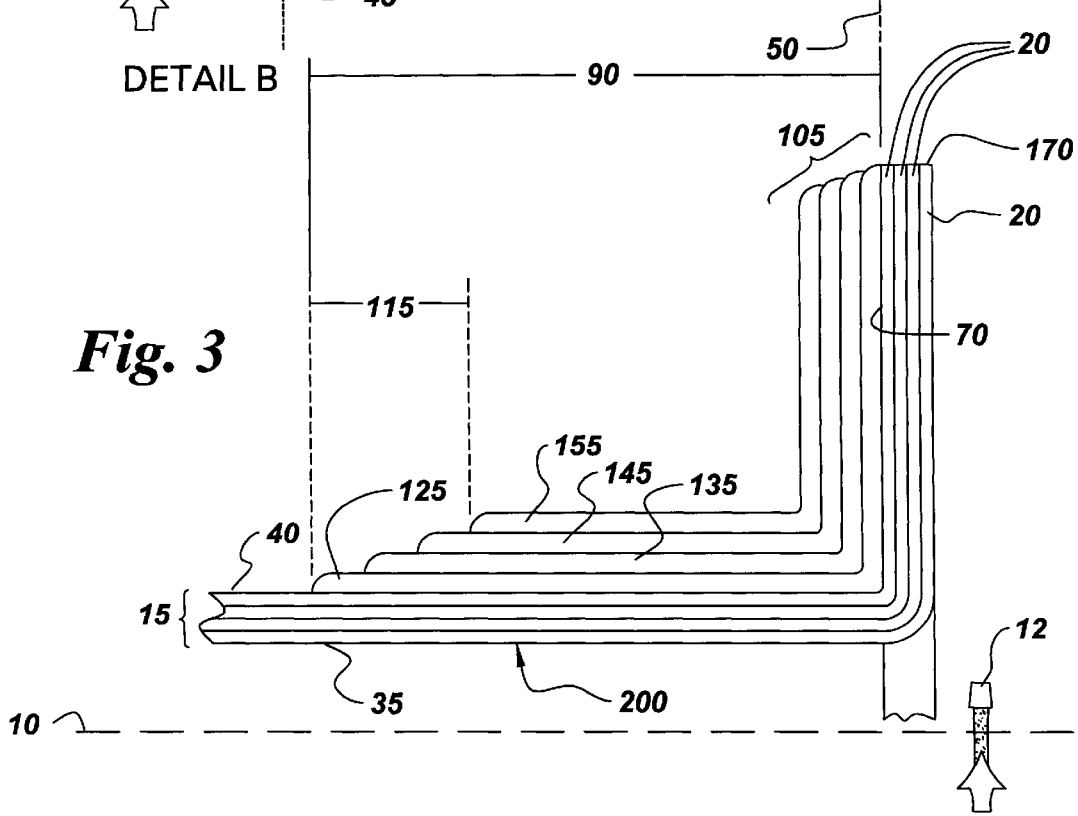

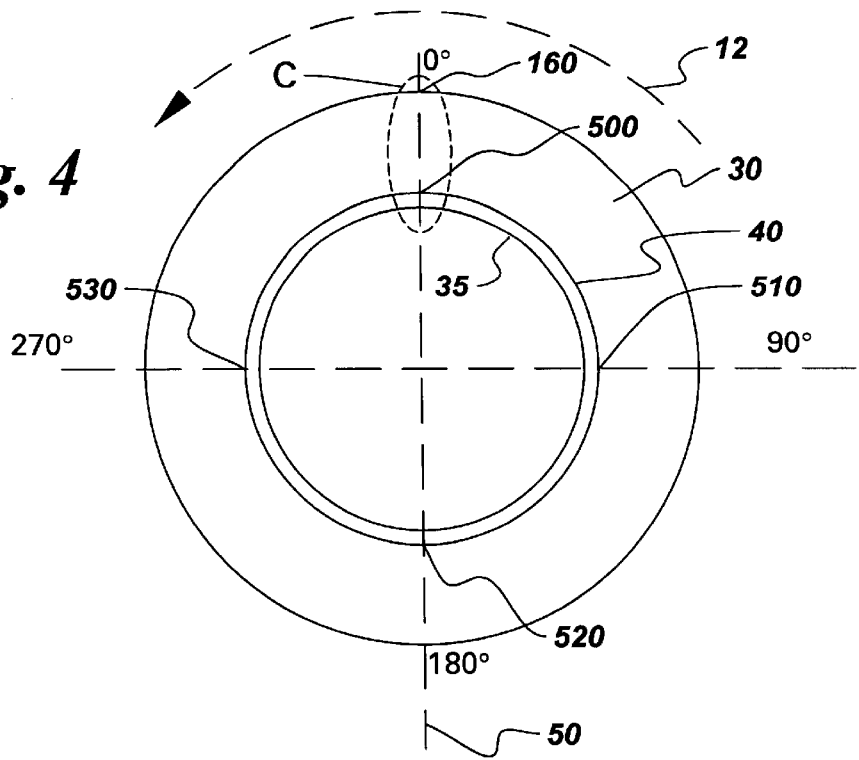
*Fig. 4*
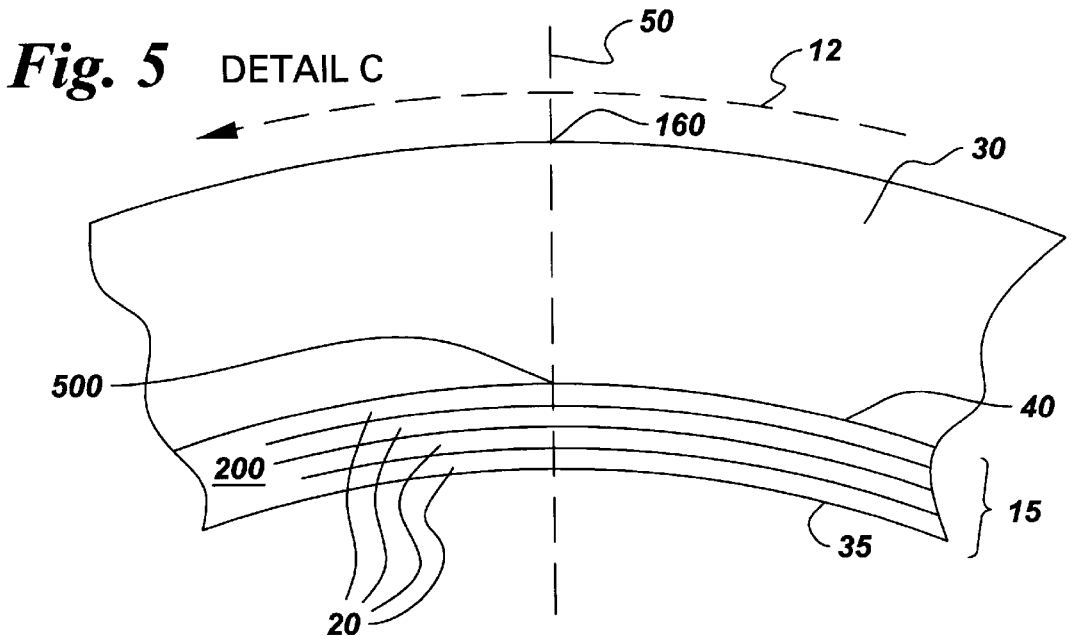
*Fig. 5* DETAIL C

Fig. 10

| Total number of laminated composite layers | Number of laminated composite layers | Fiber angle orientation in prepregs with respect to circumferential axis (degrees) | Thickness (mm) | Material |
|---|---|---|---|---|
| 21 | 1 Outermost layer | -45 | 0.27 | S - glass epoxy |
| 20 | 1 | 45 | 0.27 | S - glass epoxy |
| 18, 19 | 2 | 90 | 0.27 | S - glass epoxy |
| 15,16,17 | 3 | 0 | 0.27 | S - glass epoxy |
| 14 | 1 | 90 | 0.27 | S - glass epoxy |
| 10,11,12,13 | 4 | 0 | 0.27 | S - glass epoxy |
| 9 | 1 | 90 | 0.27 | S - glass epoxy |
| 6,7,8 | 3 | 0 | 0.27 | S - glass epoxy |
| 4,5 | 2 | 90 | 0.27 | S - glass epoxy |
| 3 | 1 | 45 | 0.27 | S - glass epoxy |
| 2 | 1 | -45 | 0.27 | S - glass epoxy |
| 1 | 1 Innermost layer | 0 | 0.27 | S - glass epoxy |
| Total | 21 | | 5.7 | |

APPARATUS AND METHOD FOR FABRICATING MAGNET SUPPORT STRUCTURE

BACKGROUND

The present invention relates generally to a superconductive magnet (such as, but not limited to, a helium-cooled and/or cryocooler-cooled superconductive magnet) used to generate a high magnetic field as part of a magnetic resonance imaging (MRI) system, and more particularly to such a magnet support structure in an MRI magnet having a closed design.

MRI systems employing superconductive or other type magnets are used in various fields such as medical diagnostics. Known superconductive magnets include liquid-helium cooled and cryocooler-cooled superconductive magnets. Typically, for a helium-cooled magnet, the superconductive coil assembly includes a superconductive main coil which is at least partially immersed in liquid helium contained in a helium dewar which is surrounded by a dual thermal shield which is surrounded by a vacuum enclosure. In a conventional cryocooler-cooled magnet, the superconductive main coil is surrounded by a thermal shield which is surrounded by a vacuum enclosure, and the cryocooler coldhead is externally mounted to the vacuum enclosure with the coldhead's first stage in thermal contact with the thermal shield and with the coldhead's second stage in thermal contact with the superconductive main coil. Nb-Ti superconductive coils typically operate at a temperature of generally 4 Kelvin, and Nb-Sn superconductive coils typically operate at a temperature of generally 10 Kelvin.

Known superconductive magnet designs include closed magnets and open magnets. Closed magnets typically have a single, tubular-shaped superconductive coil assembly having a bore. The superconductive coil assembly includes several radially aligned and longitudinally spaced-apart superconductive main coils each carrying a large, identical electric current in the same direction. The closed MRI magnet typically has a single superconductive coil assembly including a generally toroidal-shaped magnet support structure surrounding a bore and having a generally longitudinally extending axis. The magnet support structure also includes a pair of longitudinally spaced apart, generally identical, and generally annular-shaped superconductive main coils each generally coaxially aligned with the longitudinally extending axis. Each main coil typically carries a generally identical first electric current in an identical first electric-current direction. Each main coil is located within the superconductive coil assembly, and each main coil has a longitudinally outermost portion. The main coils are thus designed to create a magnetic field of high uniformity within a spherical imaging volume centered within the magnet's bore where the object to be imaged is placed. Closed MRI magnets tend to have a relatively long axial (i.e., longitudinal) length to accommodate the number of main superconductive coils needed to achieve a homogeneous imaging volume. The relatively long axial length tends to create claustrophobic feelings in patients, especially in the case of whole-body magnets.

What is needed is a magnet support structure for a closed MRI magnet that is designed to have a relatively short axial (i.e., longitudinal) length to overcome the claustrophobic feelings of patients, while simultaneously providing physicians at least some patient access.

BRIEF DESCRIPTION

The present invention provides a magnet support structure. A cylindrical portion comprises a plurality of laminated composite layers concentrically assembled to one another along a longitudinal axis. An integral left flange is comprised of the laminated composite layers concentrically assembled with respect to a left flange axis. The left flange axis is perpendicular to the longitudinal axis. An integral right flange is comprised of the laminated composite layers concentrically assembled with respect to a right flange axis. The right flange axis is perpendicular to the longitudinal axis. A method for fabricating the magnet support structure comprises concentrically assembling the plurality of laminated composite layers along the longitudinal axis forming the cylindrical portion, concentrically assembling the laminated composite layers with respect to the left flange axis forming the integral left flange, and concentrically assembling the laminated composite layers with respect to the right flange axis forming the integral right flange.

DRAWINGS

These and other features, aspects, and advantages of the present invention will become better understood when the following detailed description is read with reference to the accompanying drawings in which like characters represent like parts throughout the drawings, wherein:

FIG. 2 is a Detail "A" of FIG. 1 that depicts a cross section of a portion of the left integral flange along the longitudinal axis of the magnet support structure of one embodiment of the present invention;

FIG. 3 is a Detail "B" of FIG. 1 that depicts a cross section of a portion of the right integral flange along the longitudinal axis of the magnet support structure of one embodiment of the present invention;

FIG. 4 is a cross section of the magnet support structure through section line 1—1 of FIG. 1 looking toward the right integral flange from the section line 1—1 of FIG. 1 of one embodiment of the present invention;

FIG. 5 is a Detail "C" of FIG. 4 that depicts the c ross section of a base laminate of one embodiment of the present invention;

Figure 1:
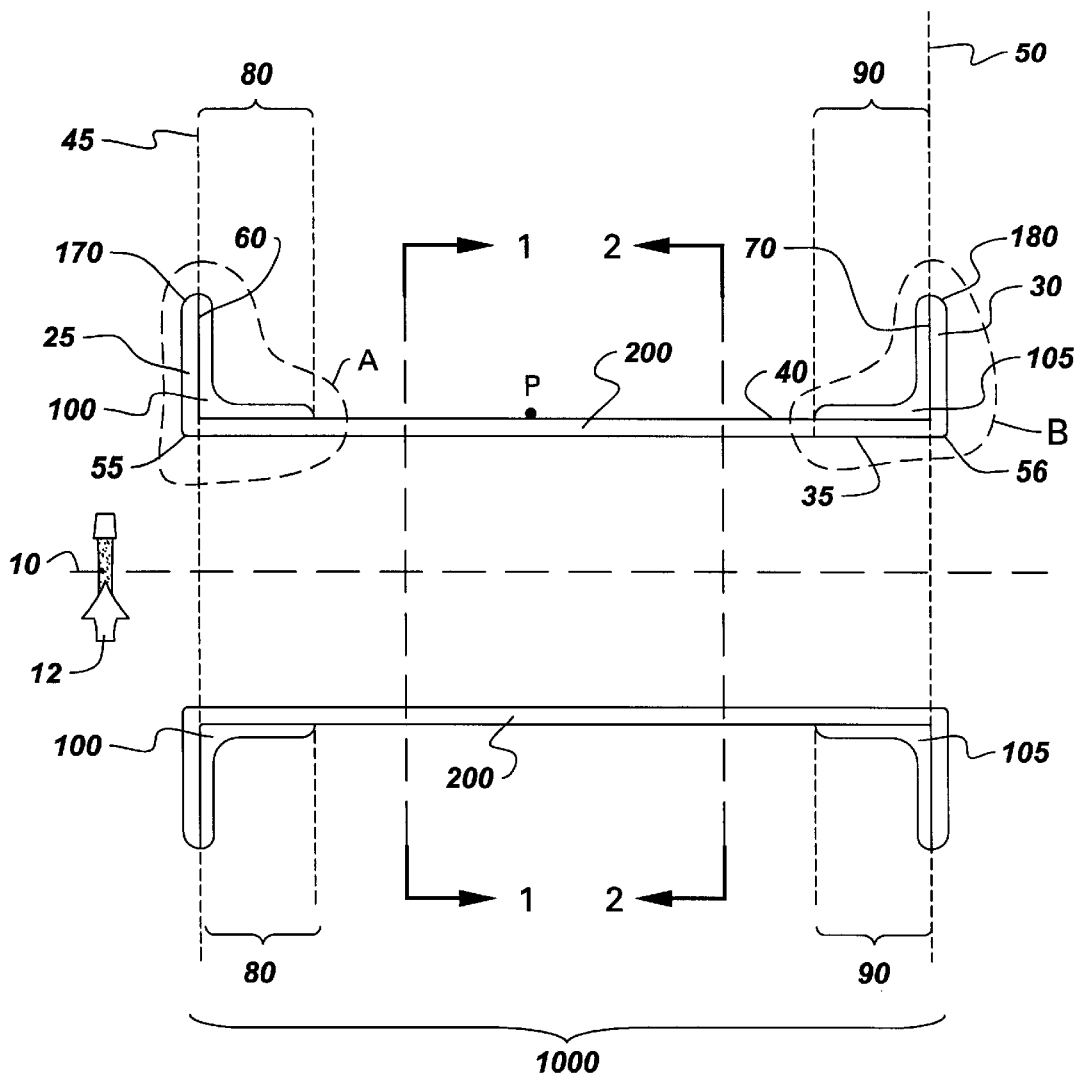
FIG. 1 is a cross sectional view along the longitudinal axis of the magnet support structure of one embodiment of the present invention.
Figure 6:
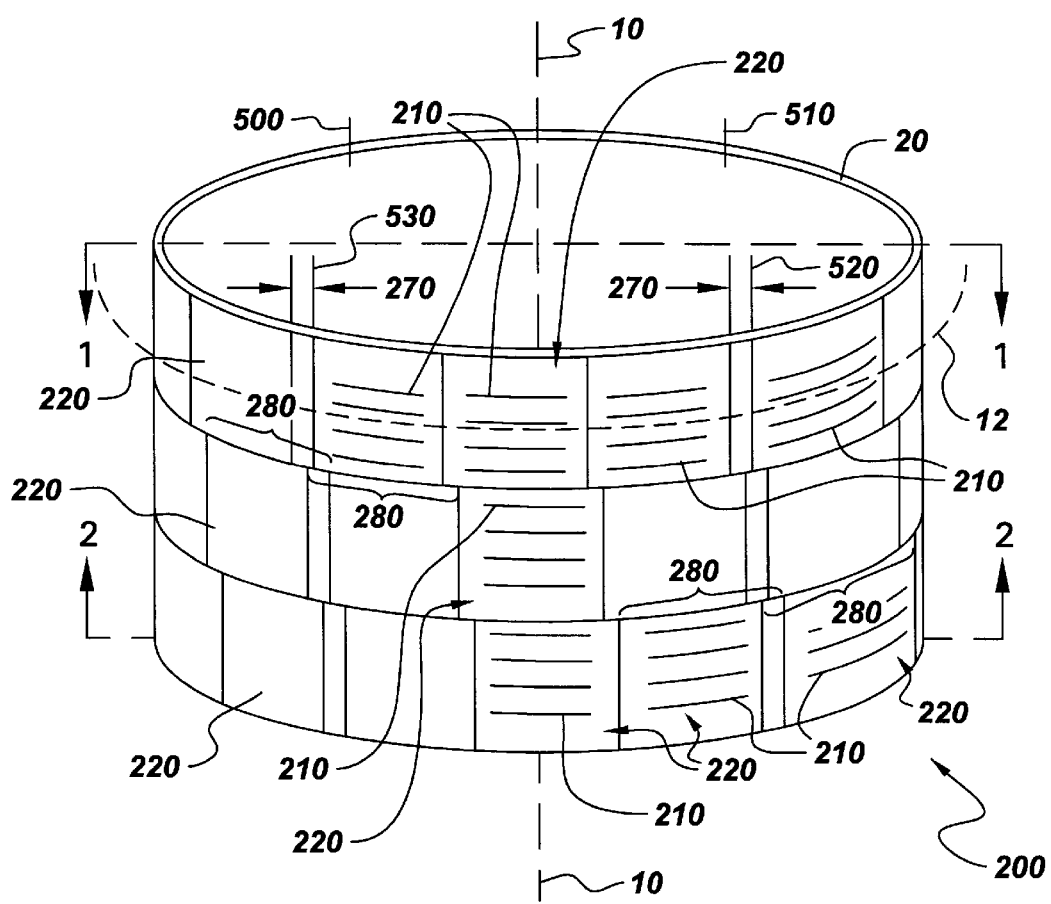
Figure 7:
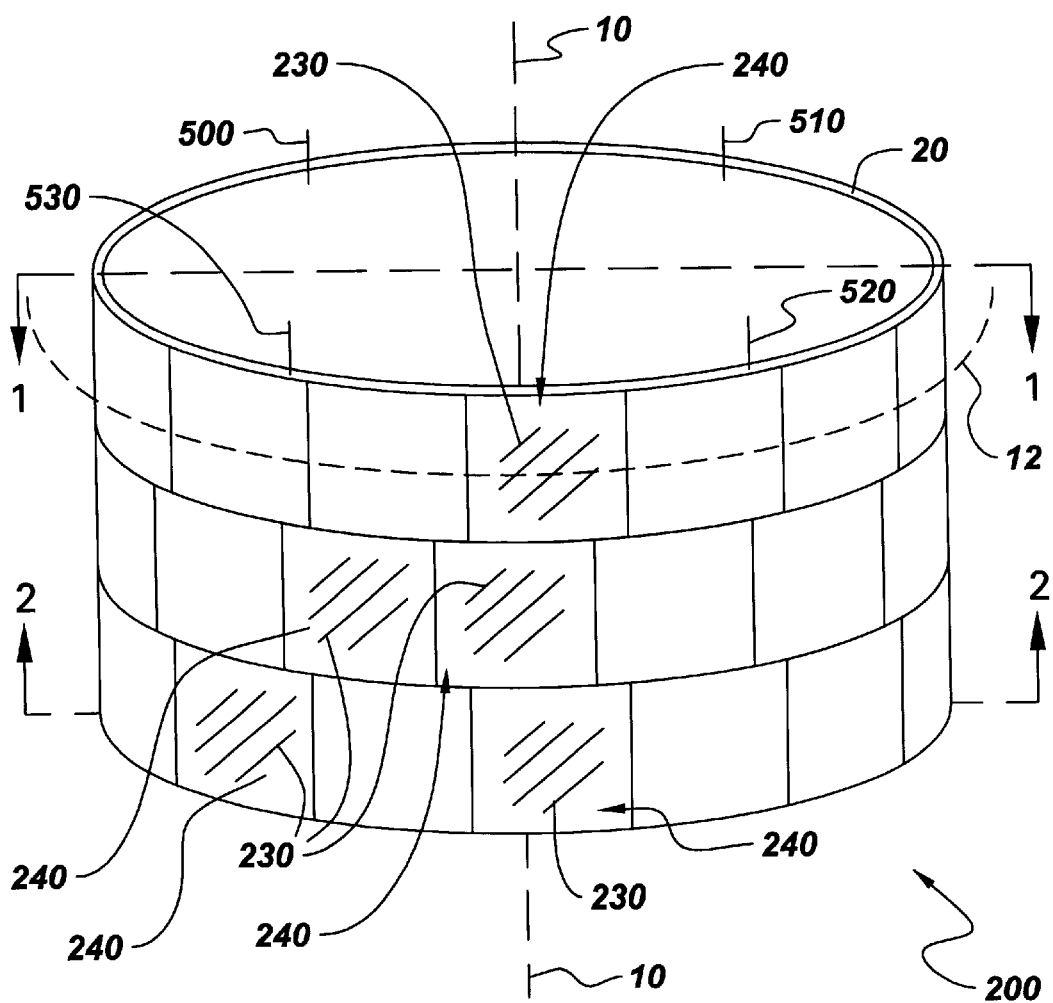
Figure 8:
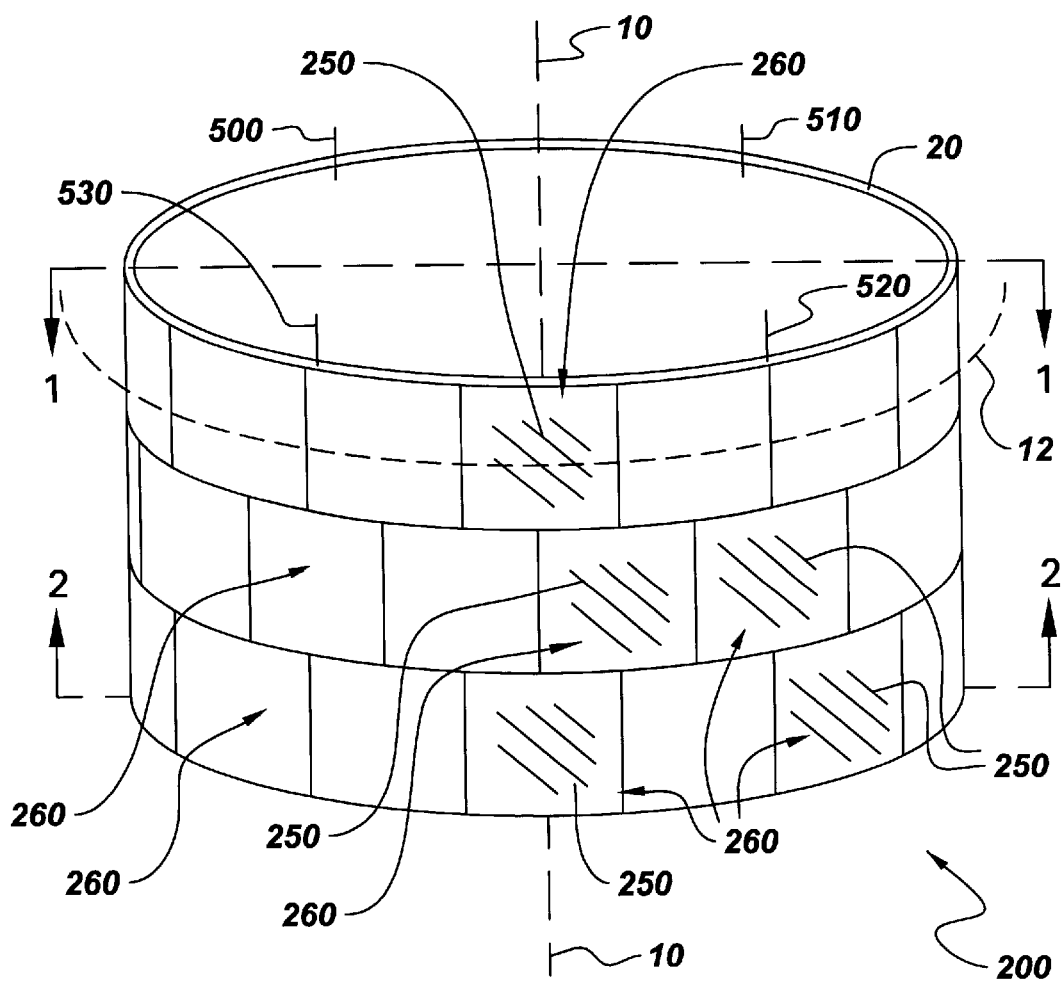
Figure 9:
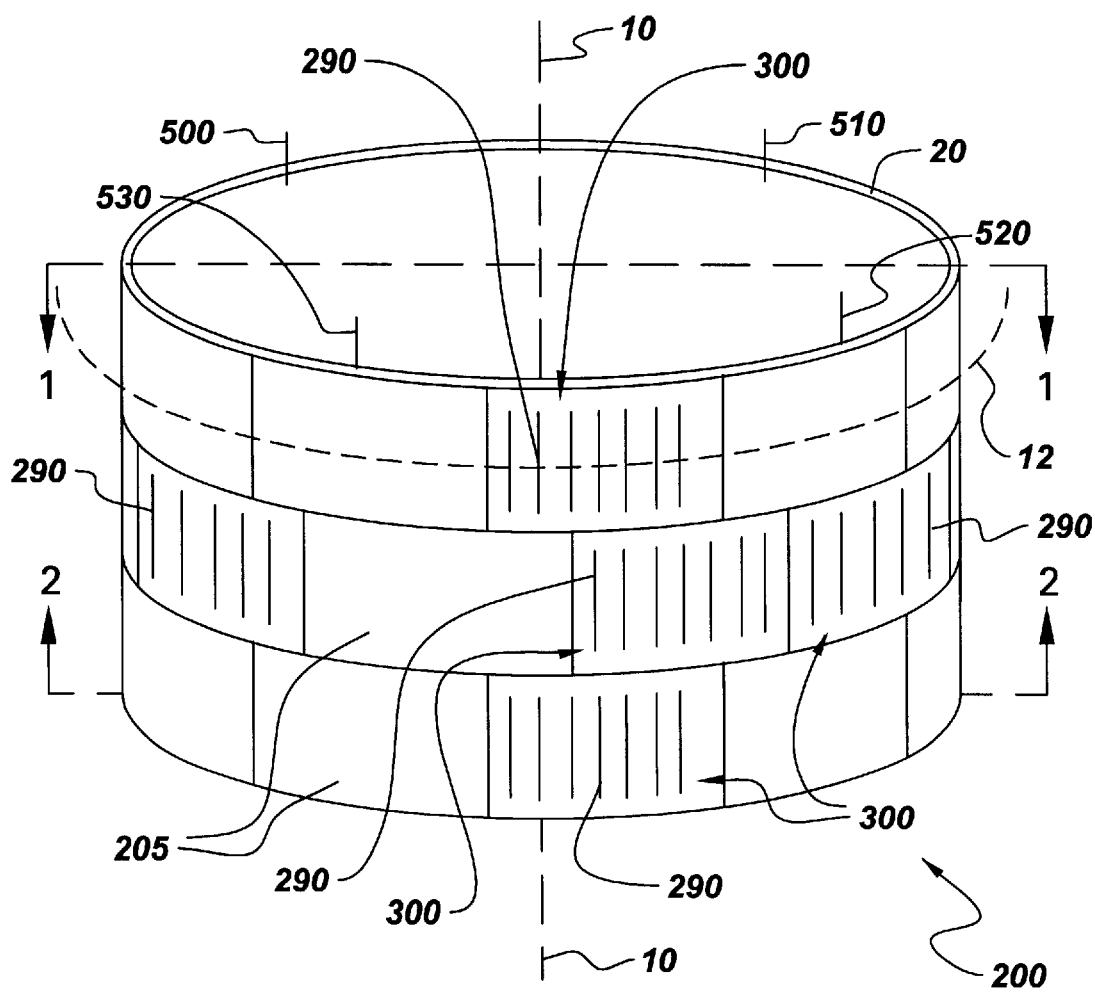

FIG. 6 is a view of one composite layer of the 0 degree prepregs of the base laminate between section lines 1—1 of FIG. 1 and section lines 2—2 of FIG. 1 along the longitudinal axis of the magnet support structure of one embodiment of the present invention;

FIG. 7 is a view of one composite layer of the 45 degree prepregs of the base laminate between section lines 1—1 of FIG. 1 and section lines 2—2 of FIG. 1 along the longitudinal axis of the magnet support structure of one embodiment of the present invention;

FIG. 8 is a view of one composite layer of the −45 degree prepregs of the base laminate between section lines 1—1 of FIG. 1 and section lines 2—2 of FIG. 1 along the longitudinal axis of the magnet support structure of one embodiment of the present invention;

FIG. 9 is a view of one composite layer of the 90 degree prepregs of the base laminate between section lines 1—1 of FIG. 1 and section lines 2—2 of FIG. 1 along the longitudinal axis of the magnet support structure of one embodiment of the present invention; and FIG. 10 provides a table that details a base laminate for one embodiment of the present invention.

DESCRIPTION

The present invention provides a magnet support structure 1000 with one embodiment being depicted in FIG. 1. The magnet support structure 1000 comprises a cylindrical portion 200. The cylindrical portion 200 comprises a plurality of laminated composite layers 20 concentrically assembled to one another along a longitudinal axis 10. An integral left flange 25 comprises the laminated composite layers 20, which are concentrically assembled with respect to a left flange axis 45. The left flange axis 45 is perpendicular to the longitudinal axis 10. An integral right flange 30 comprises the laminated composite layers 20, which are concentrically assembled with respect to a right flange axis 50. The right flange axis 50 is perpendicular to the longitudinal axis 10. The plurality of laminated composite layers 20 comprises the base laminate 15 of FIG. 2. As used herein, the terms "integral left flange" and "integral right flange" mean that the same laminated composite layers 20 that comprise the cylindrical portion 200 also comprise the integral left flange 25 and the integral right flange 30.

As used in the present invention, a coordinate system defines the radial, tangential, and axial directions, where the coordinate system is depicted in FIG. 1. In the coordinate system, a point P is located on an outer surface 40 of the cylindrical portion 200 using cylindrical polar coordinates (s, c, and a), defining the unit coordinate vectors, ŝ, ĉ, and a in the radial, circumferential, and axial directions, respectively. The angular orientation of the laminated composite layer 20, prepregs that comprise each laminated composite layer 20, and glass fibers that comprise each prepreg are described by the angle in the ĉ, â plane measured in the right-hand sense about the ŝ direction from the ĉ direction. The angular orientation is defined to have an angle in a range from –90 degrees to 90 degrees. In the present invention, the circumferential direction ĉ lies on a circumferential axis 12 and the axial direction â lies on the longitudinal axis 10.

As used herein, the term "prepreg" is defined to include 90 degree prepregs 300 of FIG. 9, 0 degree prepregs 220 of FIG. 6, –45 degree prepregs 260 of FIG. 8, and 45 degree prepregs 240 of FIG. 7. As used herein, the term "glass fiber" is defined to include 90 degree glass fibers 290 of FIG. 9, 0 degree glass fibers 210 of FIG. 6, –45 degree glass fibers 250 of FIG. 8, and 45 degree glass fibers 230 of FIG. 7.

In another embodiment of the present invention, the magnet support structure 1000 of FIG. 1 further comprises a first set 100 and a second set 105. The first set 100 comprises at least one left laminated composite layer 120, 130, 140, and 150 of FIG. 2 and the second set 105 comprises at least one right laminated composite layer 125, 135, 145, and 155. As used herein, the term "left laminated composite layer" is define to include a first left laminated composite layer 120, a second left laminated composite layer 130, a third left laminated composite layer 140, and a fourth left laminated composite layer 150. As used herein, the term "right laminated composite layer" is define to include a first right laminated composite layer 125, a second right laminated composite layer 135, a third right laminated composite layer 145, and a fourth right laminated composite layer 155. The cylindrical portion 200 of FIG. 1 is generally cylindrically shaped having an inner surface 35 and an outer surface 40. The integral left flange 25 has a left inner surface 60 that is closest to the integral right flange 30. The integral right flange 30 has a right inner surface 70 that is closest to the integral left flange 25.

In one embodiment of the present invention, one portion of the outer surface 40 comprises a left region 80 that is adjacent to the integral left flange 25 and another portion of the outer surface 40 comprises a right region 90 that is adjacent to the integral right flange 30. The at least one left laminated composite layer 120, 130, 140, and 150 of FIG. 2 of the first set 100 is disposed on the one portion of the outer surface 40 in the left region 80 and the left inner surface 60 of the integral left flange 25. The at least one right laminated composite layer 125, 135, 145, and 155 of FIG. 3 of the second set 105 is disposed on the another portion of the outer surface 40 in the right region 90 and the right inner surface 70 of the integral right flange 30.

In another embodiment of the present invention, the left region 80 of FIG. 2 further comprises a left transitional region 110 and the right region 90 of FIG. 3 further comprises a right transitional region 115. The first set 100 of FIG. 2 further comprises the first left laminated composite layer 120 that is disposed on one portion of the outer surface 40 in the left region 80 including the left transitional region 110 and the left inside surface 60 of the integral left flange 25. The first right laminated composite layer 125 of FIG. 3 of the second set 105 is disposed on one portion of the outer surface 40 in the right region 90 including the right transitional region 115 and the second inside surface 70 of the integral right flange 30.

In another embodiment of the present invention, the first set 100 of FIG. 2 further comprises the second left laminated composite layer 130 disposed on a portion of the first left laminated composite layer 120. The second set 105 of FIG. 3 further comprises the second right laminated composite layer 135 disposed on a portion of the first right laminated composite layer 125.

In another-embodiment of the present invention, the third left laminated composite layer 140 of FIG. 2 of the first set 100 is disposed on a portion of the second left laminated composite layer 130. The third right laminated composite layer 145 of FIG. 3 of the second set 105 is disposed on a portion of the second right laminated composite layer 135.

In another embodiment of the present invention, the fourth left laminated composite layer 150 of FIG. 2 of the first set 100 is disposed on a portion of the third left laminated composite layer 140. The fourth right laminated composite layer 155 of FIG. 3 of the second set 105 is disposed on a portion of the third right laminated composite layer 145.

In another embodiment of the present invention, the fourth left laminated composite layer 150 of FIG. 2 does not extend over the left transitional region 110. The fourth right laminated composite layer 155 of FIG. 3 does not extend over the right transitional region 115.

Up to four left laminated composite layers in the first set 100 of FIG. 2 and up to four right laminated composite layers in the second set 105 in FIG. 3 represent various embodiments of the present invention. However, the present invention is by no means limited to the use of only one to four left laminated composite layers in the first set 100 of FIG. 2 and only one to four right laminated composite layers in the second set 105 of FIG. 3. The use of one to four left laminated composite layers and the use of one to four right laminated composite layers is provided for illustration purposes only and is not intended to imply a limitation to the present invention. The final number of the left laminated composite layers that comprise the first set 100 of FIG. 2 and the final number of the right laminated composite layers that comprise the second set 105 of FIG. 3 is left to the artisan. The final number of left laminated composite layers in the first set 100 and the final number of right laminated composite layers in the second set 105 depends upon the application specific loading requirements applied to the magnet support structure 1000 of FIG. 1.

In one embodiment of the present invention, the portion of the first left laminated composite layer 120 not covered by the second left laminated composite layer 130 is about 13 mm. The portion of the second left laminated composite layer 130 not covered by the third left laminated composite layer 140 is about 13 mm. The portion of the third left laminated composite layer 140 not covered by the fourth left laminated composite layer 150 is about 13 mm. The portion of the first left laminated composite layer 120 not covered by the second left laminated composite layer 130, the portion of the second left laminated composite layer 130 not covered by the third left laminated composite layer 140, and the portion of the third left laminated composite layer 140 not covered by the fourth left laminated composite layer 150 is provided for illustration and is not intended to imply a limitation to the present invention.

In one embodiment of the present invention, the portion of the first right laminated composite layer 125 not covered by the second right laminated composite layer 135 is about 13 mm. The portion of the second right laminated composite layer 135 not covered by the third right laminated composite layer 145 is about 13 mm. The portion of the third right laminated composite layer 145 not covered by the fourth right laminated composite layer 155 is about 13 mm. The portion of the first right laminated composite layer 125 not covered by the second right laminated composite layer 135, the portion of the second right laminated composite layer 135 not covered by the third right laminated composite layer 145, and the portion of the third right laminated composite layer 145 not covered by the fourth right laminated composite layer 155 is provided for illustration and is not intended to imply a limitation to the present invention.

In one embodiment of the present invention, prepregs are constructed from a controlled flow modified epoxy. One example of prepregs constructed from the controlled flow modified epoxy are NCT-301 modified epoxy prepregs produced by Newport Adhesives and Composites, Inc. 1822 Reynolds Ave., Irvine, Calif. 92614. The NCT-301 modified epoxy prepregs are provided for illustration purposes only and do not imply a limitation to the present invention. The glass fibers are impregnated into each individual prepreg in one particular direction with respect to the circumferential axis 12. Therefore, the glass fibers in each individual prepreg have a same angular orientation.

In the present invention, the term "glass fiber material" is defined to mean that the glass fiber material is selected from the group consisting of S-glass fibers, E-glass fibers, and any combination thereof. In one embodiment of the present invention, the S-glass fibers are impregnated into the NCT-301 controlled flow modified epoxy prepreg. In another embodiment of the present invention, the E-glass fibers are impregnated into the NCT-301 controlled flow modified epoxy prepreg. The S-glass fibers impregnated in the NCT-301 modified epoxy prepreg and the E-glass fibers impregnated in the NCT-301 modified epoxy prepreg are provided for illustration purposes only and do not imply a limitation to the present invention.

In the present invention, the term "0 degree prepreg" is defined to mean that the glass fibers in the 0 degree prepreg 220 are aligned in an overall orientation having a range from about −5 degrees to about 5 degrees with respect to the circumferential axis 12. In the present invention, the term "−45 degree prepreg" is defined to mean that the glass fibers in the −45 degree prepreg 260 are aligned in an overall orientation having a range from about −40 degrees to about −50 degrees with respect to the circumferential axis 12. In the present invention, the term "45 degree prepreg" is defined to mean that the glass fibers in the 45 degree prepreg 240 are aligned in an overall orientation having a range from about 40 degrees to about 50 degrees with respect to the circumferential axis 12. In the present invention, the term "90 degree prepreg" is defined to mean that the glass fibers in the 90 degree prepreg 300 are aligned in an overall orientation having a range from about 85 degrees to about 95 degrees with respect to the circumferential axis 12.

In the present invention, the term "0 degree glass fibers" is defined to mean that the 0 degree glass fibers 210 are aligned in a range from about −5 degrees to about 5 degrees with respect to the circumferential axis 12. In the present invention, the term "−45 degree glass fibers" is defined to mean that the −45 degree glass fibers 250 are aligned in a range from about −40 degrees to about −50 degrees with respect to the circumferential axis 12. In the present invention, the term "45 degree glass fibers" is defined to mean that the 45 degree glass fibers 230 are aligned in a range from about 40 degrees to about 50 degrees with respect to the circumferential axis 12. In the present invention, the term "90 degree glass fibers" is defined to mean that the 90 degree glass fibers 290 are aligned in a range from about 85 degrees to about 95 degrees with respect to the circumferential axis 12.

In another embodiment, the first left laminated composite layer 120 of FIG. 2 comprises 90 degree prepregs 300 of FIG. 9 that are comprised of 90 degree glass fibers 290. The second left laminated composite layer 130 of FIG. 2 comprises 0 degree prepregs 220 of FIG. 6 that are comprised of 0 degree glass fibers 210. The third left laminated composite layer 140 of FIG. 2 comprises 90 degree prepregs 300 of FIG. 9 that are comprised of the 90 degree glass fibers 290. The fourth left laminated composite layer 150 of FIG. 2 comprises 0 degree prepregs 220 of FIG. 6 that are comprised of the 0 degree glass fibers 210.

In another embodiment, the first right laminated composite layer 125 of FIG. 3 comprises 90 degree prepregs 300 of FIG. 9 that are comprised of the 90 degree glass fibers 290. The second right laminated composite layer 135 of FIG. 3 comprises 0 degree prepregs 220 of FIG. 6 that are comprised of the 0 degree glass fibers 210. The third right laminated composite layer 145 of FIG. 3 comprises 90 degree prepregs 300 of FIG. 9 that are comprised of the 90 degree glass fibers 290. The fourth right laminated composite layer 155 of FIG. 3 comprises 0 degree prepregs 220 of FIG. 9 that are comprised of the 0 degree glass fibers 210.

In one embodiment of the present invention, the integral left flange 25 of FIG. 1 has an inner left flange surface 55 and the integral right flange 30 has an inner right flange surface 56. The inner left flange surface 55, the inner right flange surface 56, and the inner surface 35 have a common radius length as measured from the longitudinal axis 10.

In one embodiment of the present invention, the integral left flange 25 has an outer left surface 170 and the integral right flange 30 has an outer right surface 180. The cylindrical portion 200 is generally cylindrically shaped having the outer surface 40. The outer left surface 170 and the outer right surface 180 have a common radius length as measured from the longitudinal axis 10 that is longer than a radius length measured from the outer surface 40 to the longitudinal axis 10.

FIG. 4 provides a cross sectional view through the section 1—1 line of FIG. 1 as viewed towards the right integral flange 30. A top dead center position 160 of FIG. 4 of the right integral flange 30 is located along the right flange axis 50. The 0 degree reference location 500 for the cylindrical portion 200 is located where the right flange axis 50 intersects the outer surface 40. The 90 degree reference location 510, the 180 degree reference location 520, and the 270 degree reference location 530 are located on the outer surface 40, 90 degrees apart as measured clockwise from the 0 degree reference location 500 viewing the right integral flange 30 from the section line 1—1 of FIG. 1.

FIG. 5 provides an enlargement of Detail C of FIG. 4 that depicts the base laminate 15 of FIG. 5 and the individual laminated composite layers 20 that comprise the cylindrical portion 200 as viewed in the proximity of the 0 degree reference location 500.

FIG. 6 provides a view of one laminated composite layer 20 in the cylindrical portion 200 as viewed between the section line 1—1 of FIG. 1 and the section line 2—2 of FIG. 1. The 0 degree prepregs 220 depicted in FIG. 6 form the laminated composite layer 20 in the cylindrical portion 200, where the 0 degree prepregs 220 are comprised of the 0 degree glass fibers 210. The 0 degree prepregs 220 are arranged so that they form overlaps 270. The overlaps 270 are established by overlapping the edges of the 0 degree prepregs 220 by about 25 cm at the 0 degree reference location 500, the 90 degree reference location 510, the 180 degree reference location 520, and the 270 degree reference location 530. The overlaps 270 for the 180 degree reference location 520 and the 270 degree reference location 530 are shown in FIG. 6; however, the overlaps 270 for the 0 degree reference location 500 and 90 degree reference location 510 are not shown in FIG. 6. A circumferential edge 280 on two adjacent 0 degree prepregs 220 is depicted to detail the overlap 270 at the 180 degree reference location 520 and the 270 degree reference location 530.

FIG. 7 provides a view of the cylindrical portion 200 as viewed between the section line 1—1 of FIG. 1 and the section line 2—2 of FIG. 1. The 45 degree prepregs 240 of FIG. 7 form the laminated composite layer 20 in the cylindrical portion 200, where the 45 degree prepregs 240 are comprised of the 45 degree glass fibers 230.

FIG. 8 provides a view of the cylindrical portion 200 as viewed between the section line 1—1 of FIG. 1 and the section line 2—2 of FIG. 1. The −45 degree prepregs 260 of FIG. 8 form the laminated composite layer 20 in the cylindrical portion 200, where the −45 degree prepregs 260 are comprised of the −45 degree glass fibers 250.

FIG. 9 provides a view of the cylindrical portion 200 as viewed between the section line 1—1 of FIG. 1 and the section line 2—2 of FIG. 1. The 90 degree prepregs 300 of FIG. 9 forms the laminated composite layer 20 in the cylindrical portion 200, where the 90 degree prepregs 300 are comprised of the 90 degree glass fibers 290.

In one embodiment of the present invention, each of the laminated composite layers 20 is comprised of a plurality of prepregs, where all the prepregs in each laminated composite layer 20 are disposed so that they have the same angular orientation with respect to the circumferential axis 12.

In one embodiment of the present invention, each of the prepregs that comprise the laminated composite layer 20 further comprises glass fibers that are disposed so that they have the same angular orientation with respect to the circumferential axis 12.

In one embodiment of the present invention, the base laminate 15 of FIG. 2 is comprised of 21 laminated composite layers 20. FIG. 10 provides a table that depicts the glass fiber angle orientations of the prepregs that make up the base laminate 15 of FIG. 2 from the innermost of the laminated composite layers 20 to the outermost of the laminated composite layers 20. In one embodiment of the present invention, the thickness of each laminated composite layer 20 is about 0.27 mm thick and the base laminate 15 has a total thickness of about 5.7 mm. In one embodiment of the present invention, the prepregs comprise an S-glass fiber/epoxy material. The design of the base laminate 15 is influenced by design requirements to provide adequate in-plane stiffness, in-plane compliance, flexural stiffness, and flexural compliance. In one embodiment of the present invention, the base laminate 15 has an unsymmetrical configuration as presented in FIG. 10.

The number of laminated composite layers 20 of FIG. 2 and orientation of the laminated composite layers 20, the prepregs, and the glass fibers in the laminated composite layers 20 depends upon the application and the final arrangement is left to the artisan. In addition, the material selection of the prepregs and the glass fibers also depends upon the application and the final material selection is left to the artisan. The specific embodiment of the base laminate 15 of FIG. 10 is provided for illustration and does not imply a limitation to the present invention.

A method for fabricating the magnet support structure 1000 of FIG. 1 comprises concentrically assembling the plurality of laminated composite layers 20 of FIG. 2 to one another along the longitudinal axis 10 forming the cylindrical portion 200 of FIG. 2. Concentrically assembling the laminated composite layers 20 with respect to the left flange axis 45 forming the integral left flange 25 of FIG. 1, where the left flange axis 45 is perpendicular to the longitudinal axis 10; and concentrically assembling the laminated composite layers 20 of FIG. 3 with respect to the right flange axis 50 forming the integral right flange 30, wherein the right flange axis 50 is perpendicular to the longitudinal axis 10.

In another embodiment of the present invention, the method for fabricating the magnet support structure 1000 of FIG. 1 further comprises disposing at least one left laminated composite layer 120, 130, 140, and 150 of FIG. 2 of the first set 100 on the one portion of the outer surface 40 in the left region 80 and the first inside surface 60 of the integral left flange 25 and disposing at least one right laminated composite layer 125, 135, 145, and 155 of FIG. 3 of the second set 105 on the another portion of the outer surface 40 in the right region 90 and the second inside surface 70 of the integral right flange 30.

In another embodiment of the present invention, the method for fabricating the magnet support structure 1000 of FIG. 1 further comprises disposing the first left laminated composite layer 120 of FIG. 2 of the first set 100 on the one portion of the outer surface 40 in the left region 80 including the left transitional region 110 and the first inside surface 60 of the integral left flange 25, and disposing the first right laminated composite layer 125 of FIG. 3 of the second set 105 on the another portion of the outer surface 40 in the right region 90 including the right transitional region 115 and the second inside surface 70 of the integral right flange 30.

In another embodiment of the present invention, the method for fabricating the magnet support structure 1000 of FIG. 1 further comprises disposing the second left laminated composite layer 130 of FIG. 2 of the first set 100 on a portion of the first left laminated composite layer 120, and disposing the second right laminated composite layer 135 of the second set 105 on a portion of the first right laminated composite layer 125.

In another embodiment of the present invention, the method for fabricating the magnet support structure 1000 of FIG. 1 further comprises disposing the third left laminated composite layer 140 of FIG. 2 of the first set 100 on a portion of the second left laminated composite layer 130, and disposing the third right laminated composite layer 145 of FIG. 3 of the second set 105 on a portion of the second right laminated composite layer 135.

In another embodiment of the present invention, the method for fabricating the magnet support structure 1000 of FIG. 1 further comprises disposing the fourth left laminated composite layer 150 of FIG. 2 of the first set 100 on a portion of the third left laminated composite layer 140, and disposing the fourth right laminated composite layer 155 of FIG. 3 of the second set 105 on a portion of the third right laminated composite layer 145.

In another embodiment of the present invention, the method for fabricating the magnet support structure 1000 of FIG. 1 is as described above, where each of the laminated composite layers 20 of FIG. 2, from the inner surface 35 to the outer surface 45 in the base laminate 15, is disposed having a specific angular orientation with respect to the circumferential axis 12.

In another embodiment of the present invention, the method for fabricating the magnet support structure 1000 of FIG. 1 is as described above, where at least one laminated composite layer 20 of FIG. 2 is comprised of the plurality of prepregs, where the prepregs in each laminated composite layer 20 are disposed so that they have the same angular orientation with respect to the circumferential axis 12.

In another embodiment of the present invention, the method for fabricating the magnet support structure 1000 of FIG. 1 is as described above, where at least one laminated composite layer 20 comprises the 90 degree prepregs 300.

In another embodiment of the present invention, the method for fabricating the magnet support structure 1000 of FIG. 1 is as described above, wherein at least one laminated composite layer 20 comprises the 45 degree prepregs 240.

In another embodiment of the present invention, the method for fabricating, the magnet support structure 1000 of FIG. 1 is as described above, wherein at least one laminated composite layer 20 comprises the −45 degree prepregs 260.

In another embodiment of the present invention, the method for fabricating the magnet support structure 1000 of FIG. 1 is as described above, wherein at least one laminated composite layer 20 comprises the 0 degree prepregs 220.

In another embodiment of the present invention, the method for fabricating the magnet support structure 1000 of FIG. 1 further comprises disposing the 0 degree prepregs 220 of FIG. 6 so that the 0 degree prepregs 220 adjacent to each other at the 0 degree reference location 500, the 90 degree reference location 510, the 180 degree reference location 520, and the 270 degree reference location 530 overlap each other by about 25 centimeters so as to form the overlaps 270.

In another embodiment of the present invention, a method for fabricating the magnet support structure 1000 of FIG. 1 comprises concentrically assembling laminated composite layers 20 of FIG. 2 to one another along the longitudinal axis 10 forming the cylindrical portion 200 of FIG. 1 having the inner surface 35 and the outer surface 40, where the cylindrical portion 200 is generally cylindrically shaped. Concentrically assembling the laminated composite layers 20 of FIG. 2 to one another with respect to the left flange axis 45 forming the integral left flange 25 of FIG. 1, where the left flange axis 45 is perpendicular to the longitudinal axis 10. Concentrically assembling the laminated composite layers 20 of FIG. 3 to one another with respect to the right flange axis 50 forming the integral right flange 30 of FIG. 1, where the right flange axis 50 is perpendicular to the longitudinal axis 10. Disposing at least one of the left laminated composite layers 120, 130, 140, and 150 of FIG. 2 of the first set 100 on the one portion of the outer surface 40 in the left region 80 including the left transitional region 110 and the first inside surface 60 of the integral left flange 25 of FIG. 1. Disposing at least one of right laminated composite layers 125, 135, 145, and 155 of FIG. 3 of the second set 105 on the another portion of the outer surface 40 in the right region 90 including the right transitional region 115 and the second inside surface 70 of the integral right flange 30 of FIG. 1.

A specific embodiment of an apparatus and a method of fabricating a magnet support structure 1000 according to the present invention have been described for the purpose of illustrating the invention and the manner in which the invention is fabricated. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

What is claimed is:

1. A magnet support structure apparatus, comprising:

a cylindrical portion comprising a plurality of laminated composite layers concentrically assembled to one another along a longitudinal axis;

an integral left flange comprising said laminated composite layers concentrically assembled with respect to a left flange axis, wherein said left flange axis is perpendicular to said longitudinal axis; and an integral right flange comprising said laminated composite layers concentrically assembled with respect to a right flange axis, wherein said right flange axis is perpendicular to said longitudinal axis;

a first set comprising at least one left laminated composite layer;

a second set comprising at least one right laminated composite layer;

wherein said cylindrical portion is generally cylindrically shaped having an inner surface and an outer surface;

wherein said integral left flange has a first inner surface closest to said integral right flange and said integral right flange has a second inner surface closet la said integral left flange;

wherein said integral left flange has an outer left surface further from said longitudinal axis than said outer surface and said integral right flange has an outer right surface further from said longitudinal axis than said outer surface;

wherein one portion of said outer surface comprises a left region adjacent to said integral left flange and another portion of said outer surface comprises a right region adjacent to said integral right flange;

wherein at least one of said first set of said left laminated composite layers is disposed on said one portion of said outer surface in said left region and said first inside surface of said integral left flange and at least one of said second set of said right laminated composite layers is disposed on said another portion of said outer surface in said right region and said second inside surface of said integral right flange.

2. The apparatus of claim 1, wherein said left region further comprises a left transitional region and said right region further comprises a right transitional region;

wherein a first left laminated composite layer of said first set is disposed on said one portion of said outer surface in said left region including said left transitional region and said first inside surface of said integral left flange;

wherein a first right laminated composite layer of said second set is disposed on said another portion of said outer surface in said right region including said right transitional region and said second inside surface of said integral right flange.

3. The apparatus of claim 2, wherein a second left laminated composite layer of said first set is disposed on a portion of said first left laminated composite layer and a second right laminated composite layer of said second set is disposed on a portion of said first right laminated composite layer.

4. The apparatus of claim 3, wherein a third left laminated composite layer of said first set is disposed on a portion of said second left laminated composite layer and a third right laminated composite layer of said second set is disposed an a portion of said second right laminated composite layer.

5. The apparatus of claim 4, wherein a fourth left laminated composite layer of said first set is disposed on a portion of said third left laminated composite layer and a fourth right laminated composite layer of said second set is disposed on a portion of said third right laminated composite layer.

6. The apparatus of claim 5, wherein said fourth left laminated composite layer does not extend over said left transitional region, and said fourth right laminated composite layer does not extend over said right transitional region.

7. The apparatus of claim 5, wherein said first left laminated composite layer comprises 90 degree prepregs that are comprised of 90 degree glass fibers with respect to a circumferential axis, said second left laminated composite layer comprises 0 degree prepregs that are comprised of 0 degree glass fibers with respect to said circumferential axis, said third left laminated composite layer comprises said 90 degree prepregs that are comprised of said plurality of said 90 degree glass fibers with respect to said circumferential axis, and said fourth left laminated composite layer comprises said 0 degree prepregs that are comprised of said 0 degree glass fibers with respect to said circumferential axis.

8. The apparatus of claim 7, wherein said 90 degree glass fibers are impregnated into said 90 degree prepregs;

wherein said 0 degree glass fibers are impregnated into said 0 degree prepregs;

wherein said 90 degree prepregs and said 0 degree prepregs are comprised of a controlled flow modified epoxy.

9. The apparatus of claim 7, wherein said 90 degree glass fibers and said 0 degree glass fibers are selected from a group consisting of S-glass fibers, E-glass fibers, and any combination thereof.

10. The apparatus of claim 5, wherein said first right laminated composite layer comprises 90 degree prepregs that are comprised of 90 degree glass fibers with respect to a circumferential axis, said second right laminated composite layer comprises 0 degree prepregs that are comprised of 0 degree glass fibers with respect to said circumferential axis, said third right laminated composite layer comprises said 90 degree prepregs that are comprised of said 90 degree glass fibers with respect to said circumferential axis, and said fourth right laminated composite layer comprises said 0 degree prepregs that are comprised of said 0 degree glass fibers with respect to said circumferential axis.

11. The apparatus of claim 10, wherein said 90 degree glass fibers are impregnated into said 90 degree prepregs;

wherein said 0 degree glass fibers are impregnated into said 0 degree prepregs;

wherein said 90 degree prepregs and said 0 degree prepregs are comprised of a controlled flow modified epoxy.

12. The apparatus of claim 10, wherein said 90 degree glass fibers and said 0 degree glass fibers are selected from a group consisting of S-glass fibers, E-glass fibers, and any combination thereof.

13. The apparatus of claim 1, wherein each of said laminated composite layers is comprised of a plurality of prepregs, wherein each of said prepregs in each of said laminated composite layers (20) has a same angular orientation with respect to a circumferential axis.

14. The apparatus of claim 13, wherein said prepregs are comprised of glass fibers disposed in said same angular orientation with respect to said circumferential axis.

15. The apparatus of claim 14, wherein said prepregs are comprised of a controlled flow modified epoxy.

16. The apparatus of claim 15, wherein said glass fibers are selected from a group consisting of S-glass fibers, E-glass fibers and any combination thereof.

17. The apparatus of claim 16, wherein at least one of said laminated composite layers is comprised of 90 degree prepregs;

wherein each of said 90 degree prepregs comprises 90 degree glass fibers with respect to said circumferential axis.

18. The apparatus of claim 16, wherein at least one of said laminated composite layers is comprised of 45 degree prepregs;

wherein each of said 45 degree prepregs comprises 45 degree glass fibers with respect to said circumferential axis.

19. The apparatus of claim 16, wherein at least one of said laminated composite layers is comprised of –45 degree prepregs;

wherein each of said –45 degree prepregs comprises –45 degree glass fibers with respect to said circumferential axis.

20. The apparatus of claim 16, wherein at least one of said laminated composite layers is comprised of 0 degree prepregs;

wherein each of said 0 degree prepregs comprises 0 degree glass fibers with respect to said circumferential axis.

21. The apparatus of claim 20, wherein said 0 degree prepregs are disposed to overlap each other by about 25 centimeters so as to form overlaps at a 0 degree reference location, a 90 degree reference location, a 180 degree reference location, and a 270 degree reference location.

22. The apparatus of claim 1, wherein a base laminate comprising said laminated composite layers has an unsymmetrical configuration.

23. A magnet support structure (1000), comprising:

a base laminate comprising a plurality of laminated composite layers;

a cylindrical portion comprising said laminated composite layers concentrically assembled to one another along a longitudinal axis;

an integral left flange comprising said laminated composite layers concentrically assembled with respect to a left flange axis, wherein said left flange is perpendicular to said longitudinal axis (10);

an integral right flange comprising said laminated composite layers concentrically assembled with respect to said right flange axis, wherein said right flange is perpendicular to said longitudinal axis;

a first set comprising at least one left laminated composite layer; and a second set comprising at least one right laminated composite layer;

wherein said cylindrical portion is generally cylindrically shaped having an inner surface and an outer surface;

wherein said integral left flange has a first inside surface closest to said integral right flange and said integral right flange has a second inside surface closest to said integral left flange; wherein said integral left flange has an outer left surface further from said longitudinal axis than said outer surface and said integral right flange has an outer right surface further from said longitudinal axis than said outer surface;

wherein one portion of said outer surface comprises a left region adjacent to said integral left flange and another portion of said outer surface comprises a right region adjacent to said integral right flange;

wherein at least one of said first set of said left laminated composite layers is disposed on said one portion of said outer surface in said left region and said first inside surface of said integral left flange and at least one of said second set of said right laminated composite layers is disposed on said another portion of said outer surface in said right region and said second inside surface of said integral right flange.

24. The apparatus of claim 23, wherein each of said plurality of laminated composite layers in said base laminate has a specific angular orientation with respect to a circumferential axis.

25. The apparatus of claim 23, wherein each of said laminated composite layers in said base laminate are comprised of glass fibers wound in a plurality of stacking sequences, said glass fibers being disposed in a same angular orientation with respect to a circumferential axis.

26. The apparatus of claim 25, wherein each of said laminated composite layers is comprised of a plurality of prepregs;

wherein each of said prepregs in said laminated composite layer has said same angular orientation with respect to said circumferential axis.

27. The apparatus of claim 26, wherein said prepregs are comprised of a controlled flow modified epoxy.

28. The apparatus of claim 27, wherein said glass fibers are selected from a group consisting of S-glass fibers, E-glass fibers and any combination thereof.

29. The apparatus of claim 28, wherein at least one said laminated composite layer comprises 90 degree prepregs, wherein each of said 90 degree prepregs comprises 90 degree glass fibers with respect to said circumferential axis.

30. The apparatus of claim 28, wherein at least one said laminated composite layer comprises 45 degree prepregs, wherein each of said 45 degree prepregs comprises 45 degree glass fibers with respect to said circumferential axis.

31. The apparatus of claim 28, wherein at least one said laminated composite layer comprises −45 degree prepregs, wherein each of said −45 degree prepregs comprises −45 degree glass fibers with respect to said circumferential axis.

32. The apparatus of claim 28, wherein at least one said laminated composite layer comprises 0 degree prepregs, wherein each of said 0 degree prepregs comprises 0 degree glass fibers with respect to said circumferential axis.

33. The apparatus of claim 32, wherein said 0 degree prepregs are disposed to overlap each other by about 25 centimeters so as to form overlaps at a 0 degree reference location, a 90 degree reference location, a 180 degree reference location, and a 270 degree reference location.

34. A method for fabricating a magnet support structure comprising the steps of:
   concentrically assembling a plurality of laminated composite layers to one another along a longitudinal axis forming a cylindrical portion;
   concentrically assembling said laminated composite layers with respect to a left flange axis (45) forming an integral left flange (25), wherein said left flange axis (45) is perpendicular to said longitudinal axis (10);
   concentrically assembling said laminated composite layers with respect to a right flange axis forming an integral right flange (30), wherein said right flange axis is perpendicular to said longitudinal axis;
   disposing at least one left laminated composite layer of a first set on one portion of an outer surface of said cylindrical portion in a left region adjacent to said integral left flange and a first inside surface of said integral left flange; and
   disposing at least one right laminated composite layer of a second set on another portion of said outer surface in a right region adjacent to said Integral right flange and a second inside surface of said integral right flange.

35. The method of claim 34 further comprising the steps of:
   disposing a first left laminated composite layer of said first set on said one portion of said outer surface in said left region including a left transitional region and a first inside surface of said integral left flange; and
   disposing a first right laminated composite layer of said second set on said another portion of said outer surface in said right region including a right transitional region and a second inside surface of said integral right flange.

36. The method of claim 35 further comprising the steps of,
   disposing a second left laminated composite layer of said first set on a portion of said first left laminated composite layer; and
   disposing a second right laminated composite layer of said second set on a portion of said first right laminated composite layer.

37. The method of claim 36 further comprising the steps of:
   disposing a third left laminated composite layer of said first set on a portion of said second left laminated composite layer; and
   disposing a third right laminated composite layer of said second set on a portion of said second right laminated composite layer.

38. The method of claim 37 further comprising the steps of:
   disposing a fourth left laminated composite layer of said first set on a portion of said third left laminated composite layer; and
   disposing a fourth right laminated composite layer of said second set is disposed on a portion of said third right laminated composite layer.

39. The method of claim 38, wherein each of said plurality of laminated composite layers in a base laminate has a specific angular orientation with respect to said circumferential axis.

40. The method of claim 37, wherein each of said laminated composite layers is comprised of a plurality of prepregs;

wherein each of said prepregs in said laminated composite layer has said same angular orientation with respect to said circumferential axis.

41. The method of claim 40, wherein at least one said laminated composite layer comprises 90 degree prepregs, wherein each of said 90 degree prepregs comprises 90 degree glass fibers with respect to said circumferential axis.

42. The method of claim 40, wherein at least one said laminated composite layer comprises 45 degree prepregs, wherein each of said 45 degree prepregs comprises 45 degree glass fibers with respect to said circumferential axis.

43. The method of claim 40, wherein at least one said laminated composite layer comprises −45 degree prepregs, wherein each of said −45 degree prepregs comprises −45 degree glass fibers with respect to said circumferential axis.

44. The method of claim 40, wherein at least one said laminated composite layer comprises 0 degree prepregs, wherein each of said 0 degree prepregs comprises 0 degree glass fibers with respect to said circumferential axis.

45. The method of claim 44, further comprising:
disposing said 0 degree prepregs to overlap each other by about 25 centimeters so as to form overlaps at a 0 degree reference location, a 90 degree reference location, a 180 degree reference location, and a 270 degree reference location.

46. A method for fabricating a magnet support structure comprising the steps of:
concentrically assembling laminated composite layers to one another along a longitudinal axis forming a cylindrical portion having an inner surface and an outer surface, wherein said cylindrical portion is generally cylindrically shaped;
concentrically assembling said laminated composite layers to one another with respect to a left flange axis forming an integral left flange; wherein said left flange axis is perpendicular to said longitudinal axis;
concentrically assembling said laminated composite layers to one another with respect to a right flange axis forming an integral right flange; wherein said right flange axis is perpendicular to said longitudinal axis;
disposing at least one left laminated composite layer of a first set on one portion of said outer surface in a left region including a left transitional region and a first inside surface of said integral left flange; and
disposing at least one laminated composite layer of a second set on another portion of said outer surface in a right region including a right transitional region and a second inside surface of said integral right flange.

* * * * *